United States Patent [19]

Philpot

[11] Patent Number: 4,791,362

[45] Date of Patent: Dec. 13, 1988

[54] MODULARIZED SOLID STATE REGISTER

[75] Inventor: Ludlow Philpot, Duluth, Ga.

[73] Assignee: Sangamo Weston, Inc., Norcross, Ga.

[21] Appl. No.: 850,575

[22] Filed: Apr. 11, 1986

[51] Int. Cl.⁴ .......................................... G01R 11/04
[52] U.S. Cl. .................................... 324/142; 324/157;
361/364; 361/394
[58] Field of Search .................... 324/142, 103 R, 156,
324/157; 361/364, 393, 394; 364/483

[56] References Cited

U.S. PATENT DOCUMENTS

| 3,586,915 | 6/1971 | Urquhart | 361/394 X |
| 4,295,181 | 10/1981 | Chang et al. | 361/394 X |
| 4,301,508 | 11/1981 | Anderson et al. | 324/116 X |
| 4,355,361 | 10/1982 | Riggs et al. | 324/103 R X |
| 4,368,519 | 1/1983 | Kennedy | 364/483 |
| 4,516,213 | 5/1985 | Gidden | 364/483 |
| 4,605,842 | 8/1986 | Losapio | 324/103 R X |

FOREIGN PATENT DOCUMENTS 2226083 12/1973 Fed. Rep. of Germany ...... 324/142

OTHER PUBLICATIONS

*Electronic Engineering,* vol. 53, No. 648, Simeon, A. et al., "Electronic Wattmeter with Differential Inputs", Feb. 1981, pp. 77–80, 85.
*Siemens Review* XLIV, No. 11, Kohler, H. et al., "Solid-State High-Precision kWh and kVArh Meter . . . ", Nov. 1977, pp. 508–513.

*Primary Examiner*—Reinhard J. Eisenzopf
*Assistant Examiner*—Stephen M. Baker
*Attorney, Agent, or Firm*—Lowe, Price, LeBlanc, Becker & Shur

[57] ABSTRACT

A modular meter assembly includes replaceable modules for a power supply, a register, a function controlling option circuit and a display of a measuring meter. The modules are provided with mechanical and electrical interconnectors, permitting for simplified assembly, repair, maintenance and replacement. An adaptor frame used with the meter assembly provides for retrofitting the improved modular structure on existing meters, to permit upgrading of the functions performed by the existing meters.

26 Claims, 4 Drawing Sheets

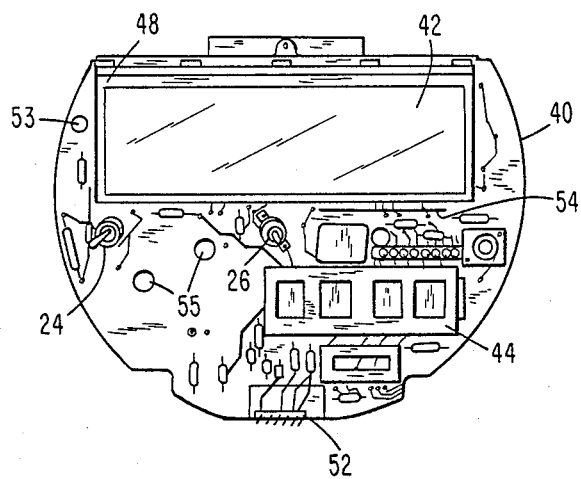
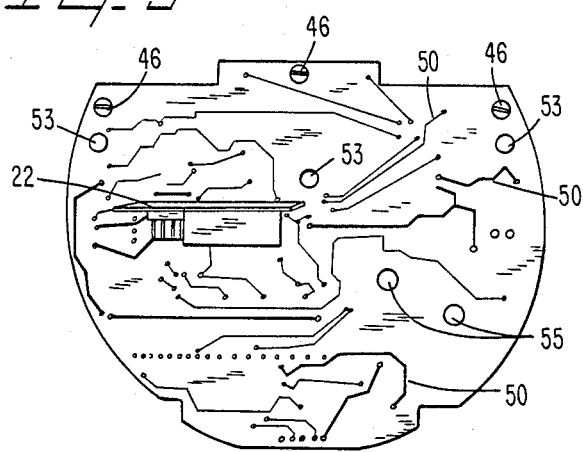
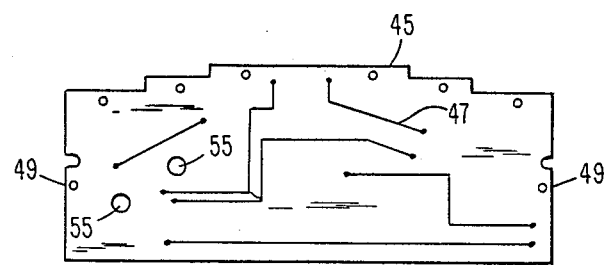

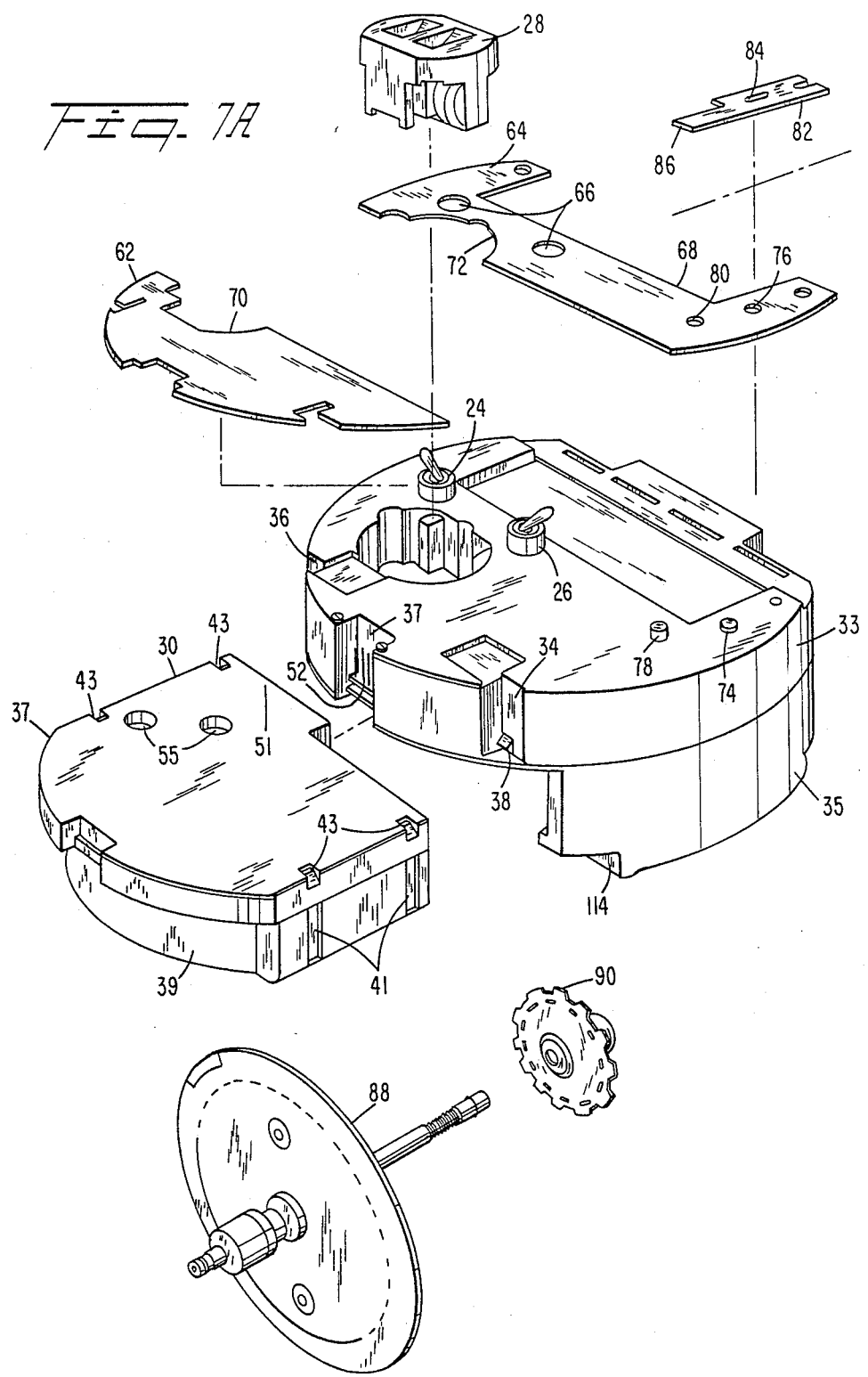

MODULARIZED SOLID STATE REGISTER

TECHNICAL FIELD

This invention relates to electrical meters, and more particularly to meters wherein various component subsystems thereof are provided in the form of interchangeable, replaceable modules having interlocking connecting structures for simplified modifications, assembly, maintenance and repair.

BACKGROUND ART

Electrical power meters are known in the art, as illustrated by a rotating disc multielement polyphase meter disclosed in U.S. Pat. No. 4,083,000 to Becker, assigned to the assignee hereof. Such meters are used for measurement of various electrical quantities, and more specifically for measurement of electrical power consumption.

However, although functioning quite well, such meters are limited in function and applicability. More specifically, a particular meter may typically be used only with one type of electrical service, unless a complex power supply is provided therefor. Further, once a decision is made with respect to including or excluding a particular functional option from a design of a particular meter, the configuration is determined and is essentially invariable.

For example, if it is determined that a particular meter is to determine power consumption only as a demand register, modification to a time-of-use register is expensive. If the meter is provided with a time-of-use register, conversion to operation as a demand register is similarly expensive.

Similarly, modification of a polyphase power meter to single phase measurement, or vice versa, cannot be done simply and without substantial effort. Thus, the entire meter must be replaced if the electrical service is changed.

However, present operating preferences of many utility companies are in a state of flux. For example, many utilities are converting from a demand measurement of power consumption to a time-of-use, or to a combined demand and time-of-use, measurement. At this time, some utilities are at an investigation level with respect to making such changes.

With the measuring meters available in the prior art, such conversions are quite expensive since, in addition to replacement of older meters, a conversion will also require replacement of new meters which may have only recently been installed to replace defective meters.

Further, when contemplating purchases of power measurement meters, the users must know in advance each of the features desired to be incorporated in the meter, since changes in meter functions, if possible, are difficult and expensive. Accordingly, a dis-incentive exists for users to upgrade the measurement equipment being used since it is difficult to predict in advance the options which may be needed at a distant time in the future.

Thus, utility companies are faced with an undesirable expense whenever selecting new metering equipment, as well as when contemplating a conversion in the method of power measurement.

Another difficulty with meters of the prior art relates to the time consumptive nature of assembly thereof, since the various elements of the measurement equipment are required to be individually mounted and connected. Thus, assembly, maintenance, or repair of prior art meters is time consumptive and thus expensive.

In recent meter design, the use of electrical registers has been advocated, either to replace or supplement the existing mechanical registers. However, even in the more recent designs, there has been provided only a single structural component which may be "plugged in" for assembly.

More specifically, in such a design a single electronic module is provided, wherein the entire meter movement, including display, power supply and transformer, function circuitry, and the like, is provided in a single module. Thus, replacement of a defective meter is made easier, in that the entire meter may be easily replaced. However, such an arrangement, while somewhat easing the maintenance process, fails to address the above described deficiencies of the prior art, particularly pertaining the modification of capabilities of a meter, maintenance, repair and assembly.

There is thus a need in the prior art for measuring devices which may be provided with varying functional capabilities as needs change, to permit upgrading and modification of existing meters.

Specifically, there is a need for meters which may be converted from one form of measurement of consumption to another form, such as from demand to time-of-use or vice versa, without requiring the entire meter to be discarded and replaced.

Additionally, there is a need in the prior art for meters which may be modified for operation on different electrical power sources without requiring complete replacement of the entire meter assembly.

Moreover, there is a need for a simplified measuring apparatus having replaceable, interchangeable modular parts which are easily assembled to form the meter.

DISCLOSURE OF INVENTION

It is accordingly an object of the present invention to overcome the difficulties of the prior art and to provide an electrical measurement apparatus having a plurality of interchangeable modules, each with appropriate interface connectors.

It is a more specific object of the invention to provide a modular meter, including a power supply module which may be interchanged with other power supply modules to permit the meter to operate at different electrical power service levels.

Still another object of the invention is to provide a modular meter having an options module, including circuitry thereon defining operating functions and capabilities of the meter, thereby to permit a meter to be upgraded for performing different sets of functions than at the time of original purchase and installation.

In accordance with these and other objects of the invention, there is provided an electrical measurement apparatus, or an electrical meter, having a plurality of modules separately housing a display register, a power supply, a measuring mechanism and electrical circuitry used therein. Each of the modules includes mechanical and electrical interconnecting means, for removably interconnecting the modules to form the meter. The electrical interconnecting means include an arrangement for making electrical contact by mechanical pressure, while the mechanical interconnecting means includes a retaining arrangement for releasably retaining the modules in a mechanical connection with one another.

In accordance with one aspect of the invention, the electrical circuitry module includes a function defining means to define functions performed by the apparatus, so that the functions performable by the meter may be upgraded merely by interchanging the circuitry module. Preferably, a register may be included in the meter, and the function defining means may include a circuit for enabling a time of use measurement function and for storing in the register both a value indicating the amount of consumed power and the time of day during which the power was consumed.

Alternatively, the function defining means may include a circuit for enabling a peak demand measurement function, in which it is only the peak demand which is measured during a billing cycle, and wherein the register is caused to store a value indicative only of the peak amount of power consumed, independently of the time of day during which the power was consumed.

In accordance with another feature of the invention, there is further provided a central interface within the meter apparatus electrical interconnecting means. The central interface includes a number of electrical connectors, for connection to the several modules, together with electrical interconnectors for electrically connecting the modules to one another. The electrical interconnectors may be provided in the form of conductive strips printed on a printed circuit board.

In accordance with still another aspect of the invention, the display register module includes a mechanical register, with plural mechanical displays, and an electrical register, with an electronic display, each housed in a separate module to permit selection of either one or both of the registers to be included in the meter.

According to yet another feature of the invention, the inventive apparatus includes an adapter which may be mounted on a standard measuring mechanism. The adapter provides a mechanical mount for the mechanical interconnectors of the modules, thus permitting retrofitting of the modules onto existing measuring mechanisms.

In accordance with the invention, the power supply module may be interchanged to provide a meter apparatus which may be used with different input voltages. More specifically, the power supply module may provide a particular output operating voltage for the various modules from a particular input voltage. A different power supply module, which provides the particular output voltage from a different input voltage, may be substituted in order to permit the meter apparatus to function in an environment wherein the different input voltage is utilized.

The interchangeable power supply module, when combined with the option module defining the functions which may be performed by the meter, enhance the power efficiency of a meter in accordance with the invention.

BRIEF DESCRIPTION OF THE DRAWINGS

FIG. 2 is a front view of a main circuit board and display used in the inventive metering apparatus;

FIG. 3 is a rear view of the circuit board and display of FIG. 2;

FIG. 4 shows a circuit board used in an electrical circuit module to define the functions performed by the meter apparatus;

FIGS. 7a and 7b show an exploded view of various component parts of the inventive modularized metering apparatus.

DETAILED DESCRIPTION OF A PREFERRED EMBODIMENT OF THE INVENTION

Figure 1:
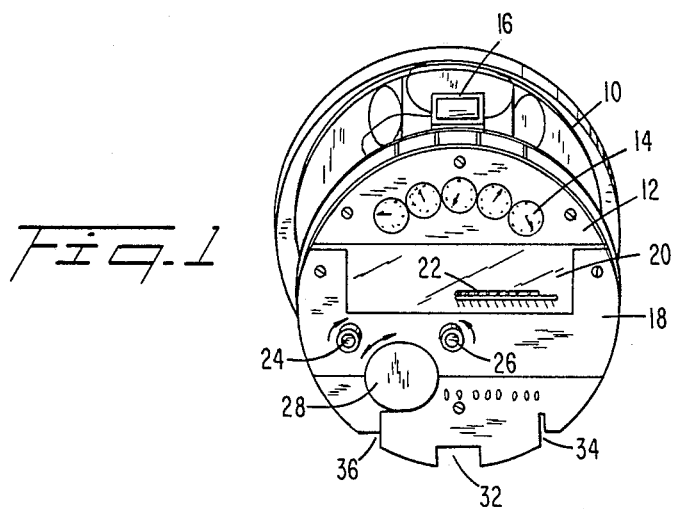
FIG. 1 shows a perspective view of a meter in accordance with the invention.

Referring now to FIGS. 1 and 7, there is shown in perspective and exploded views an assembled power measuring assembly in accordance with the present invention.

Figure 7B:
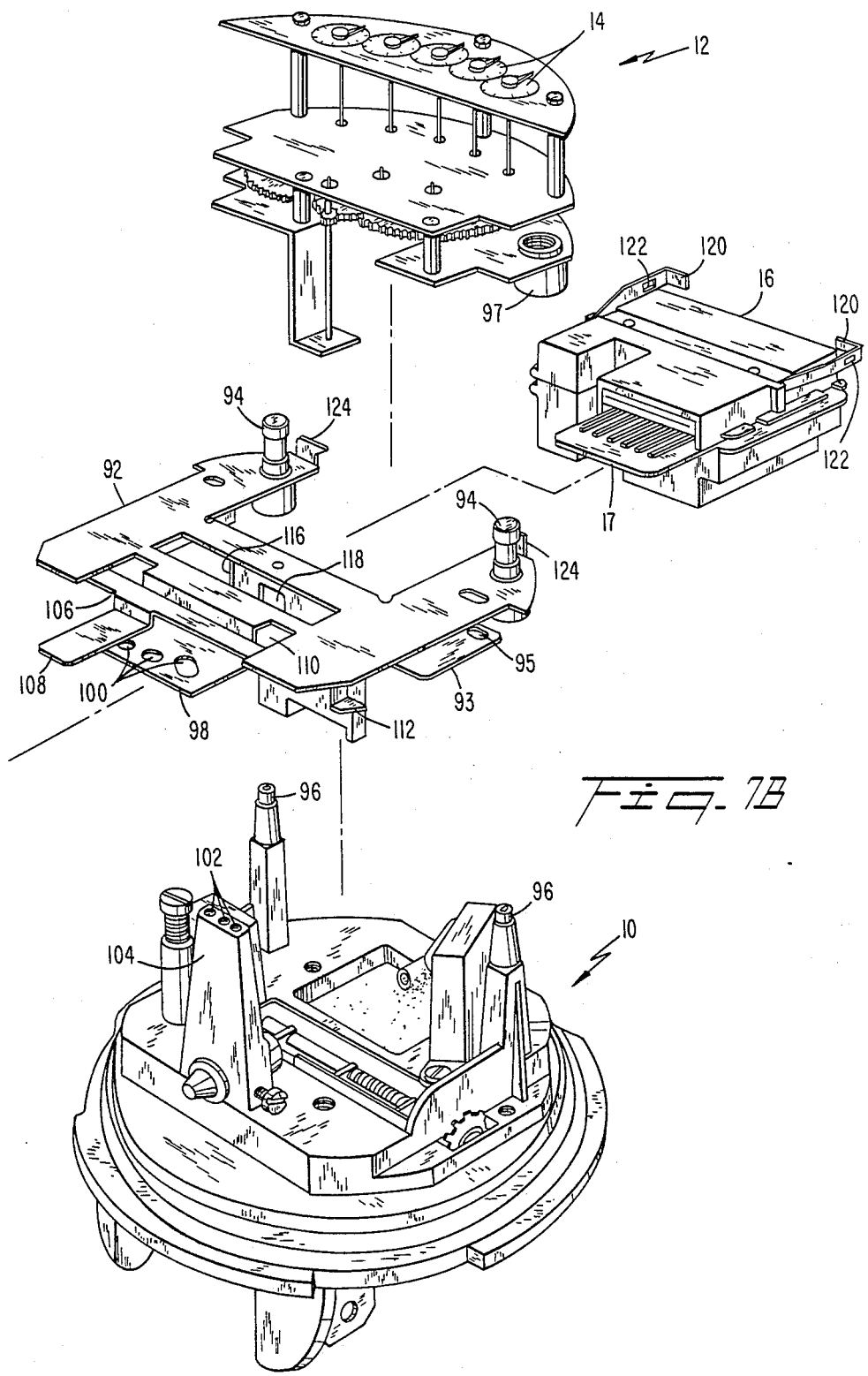

More specifically, in the assembled meter there are provided a basic measurement module 10, the details of which are known in the art and are further shown in FIG. 7b, and a mechanical register module 12 connected thereto and arranged to provide a mechanical display of the power measured thereby on a plurality of rotatable metering displays 14. A power supply module 16 is connected to the measurement module 10, and a main register module 18, including an opening 20 for an electronic display, shown at 42 in FIG. 2, is provided to complete the assembly. The power supply module 16 includes a printed circuit board which includes thereon the controlling circuitry of the module. Although the printed circuit board is not shown, the structural details of the power supply module 16 structure may be seen on reference to FIG. 7b. As seen therein, an electrical connector 17 is provided for the power supply module.

As seen in FIGS. 1 and 3, a central interface module, or motherboard, 22 is mounted in the assembly. Structural details of the motherboard 22 may be seen in FIG. 6, and are described hereinbelow. A pair of switches 24, 26 are provided at the forward surface of the main register module 18, with access available to a user by means of rotatable knobs as seen in FIG. 1. The switches are respectively operable as follows. Switch 24 is operable to control the electrical register portion of the circuit to display demand power consumption or to reset the same, while switch 26 is operable to provide specialized display sequences.

The switch 24 is controlled by a meter reader, upon reading the peak kilowatt reading at the end of a billing cycle, such as at each month, to reset the register and electronic display to provide a reading of the power consumed during the upcoming billing period. Switch 26 is controllable to rearrange the display sequences, by displaying normal data pertaining to consumed power, test data to calibrate the meter or otherwise to test operation thereof, and special data such as that pertaining to a number of power outages which may have occurred during the previous billing cycle, pertaining to attempted tampering, or the like. Typically, the switches may be within a glass envelope for the meter apparatus, and a pair of knobs, such as seen in FIG. 1, or other connectors, may protrude through the envelope or be otherwise accessible by the meter reader to provide the desired display controls. As shown in FIG. 1, the control knobs provided for the two switches are preferably rotatable control knobs.

A battery module 28 is shown in FIG. 1, and details thereof are seen in FIG. 7a. The module 28 includes therein a battery for backup of a real time clock, used in the meter when a time-of-use option is provided by an option module 30, shown in FIG. 7a. Also shown in FIG. 1 is an opening 32 in the main register module 18 for an optical communication port, which provides communication between a LED emitter, external to the meter, and a receiver internal to the meter, through the meter cover (not shown).

The main register module 18, as well as the other modules in the inventive arrangement, is provided with a mechanically interlocking, or interconnecting, structure, as illustrated by notches 34 and 36. As shown in FIG. 7a, for example, notch 34 includes a latch 38, forming a tongue-and-groove arrangement for snap-fitting various components of the modular meter assembly. More specifically, the main register module 18 is composed of a housing having upper and lower portions 33 and 35, more clearly seen in FIG. 7a. The two housing portions are mechanically maintained by an interconnection including latches 38 in lower portion 35 and notches therefor in upper housing portion 33, forming a tongue-and-groove arrangement for retaining the two portions in mechanical contact.

Similarly, option module 30 is comprised of a housing having upper and lower portions 37 and 39, seen in FIG. 7a. To retain the two portions in contact, lower portion 39 is formed with spring members 41, having latching projections at the upper ends thereof for latching engagement with notches 43 formed in upper portion 37. Retained within the housing of option module 30 is a printed wiring board 45, shown in FIG. 4. The wiring board includes a specific wiring pattern 47 printed thereon to provide appropriate interconnections among various components of the meter assembly, thus to define the functions which may be performed by the meter assembly.

The wiring board 45 is retained in the housing 30 of the option module by means of a pair of molded round posts formed on the interior surface of one of the two housing portions thereof in cooperation with a pair of holes 49 formed in the wiring board. Additionally, the board is captured by the physical dimensions of the walls of the two housing portions, wherein one of the two portions is provided with an interior portion in vertical contact with the board 45, for vertically capturing the same. In other words, a molded opening is provided in the housing of option module 30 for capturing the wiring board therein. An electrical connector is provided at 51, within the housing of option module 30, for interconnecting with motherboard 22.

Referring now to FIG. 2, there is shown the main circuit board 40 of the inventive metering assembly, together with an electronic display 42, which may be a liquid-crystal-display (LCD) or any other suitable display type known in the art. The main board is housed, supported, enclosed and maintained between the two housing portions 33 and 35 of the main register module.

A socket 44 is provided for a controlling microprocessor, to be mounted on the main circuit board. The two switches 24 and 26 are shown as being mounted on the main circuit board 40, and several other standard circuit components are similarly shown mounted on the board.

The display 42 is mounted to board 40 on a spongy elastomeric connector (not shown), including a number of conductive carbon strips embedded therein for making electrical connections between the display 42 and various circuits on board 40. As seen on the rear view of the main board shown in FIG. 3, a number of screws 46 are used to fasten a plastic retainer 48 (FIG. 2) to the board, and thus to retain the display 42 on board 40. Wiring circuitry, in the form of printed circuit conductors 50, is provided on the backplane of the main circuit board 40 to interconnect the various electrical components thereon.

A connector 52 is provided on the front surface of the main board 40 for providing contact with the optical port formed in opening 32 of the main register module 18.

Figure 6:
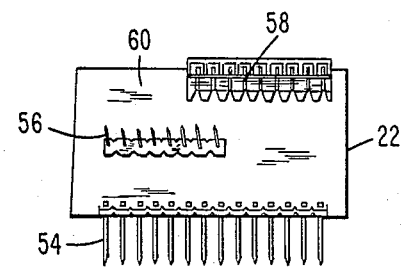
FIG. 6 shows a central interface module, attached to the main circuit board of FIGS. 2 and 3, for electrical interconnection to the modules of the inventive arrangement.

On the back surface of the main circuit board 40, seen in FIG. 3, there is provided an electrical connector (not shown) for connection to the central interface module, motherboard 22, shown in detail in FIG. 6. It should be noted that motherboard 22 is mounted onto the rear portion of the main circuit board 40 by means of electrical connectors which also function to provide mechanical interconnection therefor.

Retaining holes 53 are provided on circuit board 40 for using screws, or other fasteners, to mount the circuit board to a pair of bosses (not shown) protruding from the bottom of upper housing 33 of the main register module housing. In assembling the register module 18, the board 40 is attached to upper housing 33 by means of a pair of screws (not shown) to be mounted within the register module upon snapping together of the two housing portions 33 and 35.

As is also seen in FIGS. 2, 3, 4 and 7a, a corresponding pair of holes 55 is provided in each of the modules and circuit boards. These holes are not used for mounting the various modules. Rather, the holes are provided to permit access therethrough to a screwdriver or the like for adjustment of various controls on the main measurement module 10.

As seen in FIG. 6, motherboard 22 includes a plurality of different electrical connectors 54, 56, 58, etc. These electrical connectors, in the form of pins, jacks, plugs and the like, are provided to make electrical contact with various ones of the modules of the inventive metering assembly. Specifically, connector 54 mounts the motherboard to the main circuit board 40, connector 56 provides electrical connection to the circuit board 45 of option module 30, and connector 58 provides electrical connection to the connector 17 of power supply module 16. It should be noted that the connection between motherboard 22 and power supply module 16, by electrical connectors 58 and 17, provides a mechanical pressure contact, which thus, together with the other mechanical interconnection arrangements, also maintains the two modules in mechanical alignment.

It will be appreciated that motherboard 22 thus makes electrical contact with the various modules of the assembly, which are electrically interfaced thereto, via mechanical pressure, as by pin insertion and retention, or the like. Thus, by avoiding a need for a permanent connection by solder or the like, the present invention permits easily interchangeable, replaceable, electrical interconnection among the various modules. Particularly, it is noted that motherboard 22 includes thereon a circuit board 60, on which are provided various interconnecting paths (not shown) to interconnect the various connectors 54, 56, 58.

Thus, upon replacement of any of the modules by other, similar, modules having appropriate but different electrical connector arrangements for connection with 54, 56, 58, the proper interconnection between the modules is assured by the circuit paths provided on the circuit board 60 of motherboard 22.

Preferably, motherboard 22 is mounted on the main board 40 by long pins 54 and a plurality of matching through holes on the board 40. Thus, as seen in FIGS. 1 and 3, motherboard 22 extends essentially perpendicularly to the main board, permitting ease of contact between the modules of the meter assembly and the various electrical connectors on the motherboard. More specifically, the power supply module and the option module may be connected to and disconnected from the motherboard by horizontal sliding movement, in view of the perpendicular arrangement of the connectors 54 and circuit board 60, on the one hand, and the connectors 56, 58, on the other. In that regard, it is noted that pins 54 extend through the board 40, and protrude through the front surface thereof, permitting still further connections to be made thereto.

Figure 5:
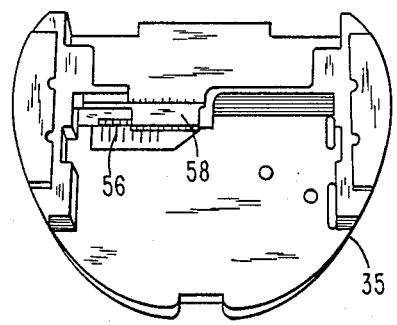
FIG. 5 shows a rear view of a bottom portion of a main register module housing for the circuit board of FIGS. 2 and 3.

Thus, as seen in FIG. 5, connectors 56 and 58 protrude below the bottom portion 35 of the main register housing to provide the horizontal, sliding, connection between the motherboard on main board 40 and the option and power supply modules, respectively.

Referring now to FIG. 7a, additional components of the assembly according to the invention are shown as follows. 62 and 64 are two face plate portions, including identification data and the like, for mounting on the upper housing portion 33 of the main register module 18. The face plate portion 64 includes a pair of openings 66 for the two switches 24 and 26, and an opening 68 to enable the display 42 of board 40 to be seen. Each portion includes a respective opening part 70, 72 for the batter module 28.

A locator pin 74 and cooperating opening 76 are provided for positioning face plate portion 64 with respect to the upper housing 33. A switch lever 78, protruding from a switch (not shown) within the upper housing 33 of main register module 18, passes through a hole 80 in face plate portion 64 and projects therethrough. A switch operating mechanism 82, in the form of a flat plate, is similarly mounted on pin 74 and is provided with a hole 84 therefor. The switch operator 82 includes a tongue portion 86 for depressing switch lever 78 when mounted in the arrangement shown in the Figure, thereby activating the switch within the main register. When rotated by 180 degrees, however, it is seen that tongue portion 86 is no longer over the switch lever 78, so that the switch is deactivated. This arrangement permits a meter reader, or other authorized personnel, to activate the switch in order to place the meter assembly in a test mode.

As also shown in FIG. 7a, a standard disk and spindle assembly 88 is provided for the meter. A shutter disk 90, arranged to be mounted on the spindle of assembly 88, is provided for electrically determining the power usage monitored by the meter. Disk 90 is fully described in a separate patent application assigned to the assignee hereof and is not part of the present invention. However, the assembly is shown herein in order to illustrate a fully operative metering apparatus.

The disk and spindle assembly is mounted on the main measurement module 10, substantially as would be known in the prior art. The shutter disk, and a sensor therefor, are similarly mounted on the main measurement module.

It should be noted that once the disk and spindle assembly is mounted onto module 10, and a register such as mechanical register module 12 is connected thereto, an operating measurement instrument results. With these elements in place, a meter will operate to measure and display an electrical quantity, such as kilowatt-hours used.

According to the present invention, however, the various modules hereinabove described may be retrofitted onto the assembly of main module 10, disk 88 and display 12.

An adaptor frame 92, shown in FIG. 7b, is provided for mounting on an existing meter or on a specially designed measurement module, as generally identified by 10 in the present specification. The remaining modules are then easily, and substantially without any mechanical tools, mounted onto adaptor frame 92 and each other, as described hereinbelow. Since the various modules are manually mountable, the same are similarly manually removable and replaceable, thereby providing a major advantage of the invention in ease of maintenance, replacement and repair.

Referring specifically to the illustrated adaptor frame 92, A bracket 93, rivetted to the bottom of frame 92, includes holes 95 for mounting to the circular posts 96 of the measurement module 10. Circular posts 94 project from the frame 92 and are used to engage receptacles 97 provided at the bottom portion of the mechanical register 12. Advantageously, posts 94 replace posts 96 of the main measurement module for engagement with the register 12, thus providing a retrofitting arrangement of the inventive assembly for existing meters.

A further portion of the mounting apparatus for the adaptor frame is shown at 98, wherein a mounting bracket includes openings 100, matching and mating with holes 102 provided in a rectangular post 104 of the measurement module 10. A number of screws or other fasteners may thus be used to fasten the adaptor frame to the measurement module.

A spring plate 106 is mounted below the adaptor frame 92, the plate including a rearwardly projecting tab 108. The spring plate 106 serves to capture at clearance 110 projections (not shown) extending downwardly from the option module 30. Further, latching tabs 112, extending from the spring plate 106, are used to engage the projections 114 extending from the bottom of the main register lower housing portion 35. A further mounting bracket, shown at 116, extends downwardly from the adaptor frame and includes an opening 118, used to mount a printed circuit board of the above described sensor (not shown) for the shutter disk 90.

Finally, a spring structure, having two forwardly extending arms 120, is attached to power supply module 16 for engaging the adaptor frame 92. A rectangular opening 122 is provided in each arm. A pair of engaging latches 124 is provided, for engaging the rectangular openings 122 and thus to interconnect the power supply module to the adaptor frame.

In the above described arrangement, manual compression of spring arms 120 will release the mechanical engagement between the adaptor frame 92 and the power supply module 16. Similarly, manual depression of tab 108 will release the projections from the option moudle, as well as the projections 114 from the main register housing, from engagement with the spring plate 106 of the adaptor frame 92, thus enabling a quick and efficient disassembly of the inventive arrangement.

Accordingly, as will be appreciated from the foregoing description of the invention, there is provided an arrangement wherein an adaptor frame may be inserted between existing components of a measurement meter, and wherein a number of additional modules may be attached thereto without the use of mechanical tools. Thus, the modules may be removed, modified, upgraded, repaired or maintained in a simple, straightforward and inexpensive manner.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilized the invention in various embodiments and with various modifications as are suited to the particular use contemplated therefor. It is intended that the scope of the invention be defined by the claims appended hereto, when interpreted in accordance with full breadth to which they are legally and equitably entitled.

I claim:

1. In an electrical measurement meter apparatus having a display register, a power supply, a measuring mechanism, and electrical circuitry defining functions performed by the meter apparatus, the improvement comprising:
    (a) a plurality of modules separately housing said display register, said power supply, said measuring mechanism and said electrical circuitry, respectively;
    (b) mechanical interconnecting means on a plurality of said display register, said power supply, said measuring mechanism and said electrical circuitry modules for removably interconnecting said modules to form said meter apparatus; and
    (c) electrical interconnecting means on each of said display register, said power supply, said measuring mechanism and said electrical circuitry modules for providing modular, replaceable, electrical interconnections among said modules;
    (d) said electrical interconnecting means including pressure means for making electrical contact by mechanical pressure on electrical connectors; and
    (e) said mechanical interconnecting means including retaining means for releasably retaining said modules in mechanical connections with one another,
    said electrical interconnecting means further comprising central interfacing means, said central interfacing means including a plurality of electrical connectors for connection to a plurality of respective modules, and electrical interconnectors connected between at least two of said electrical connectors,
    said central interfacing means comprising separate subsidiary circuit board means for permitting connection of one of said modules to another of said modules,
    wherein said electrical connectors are mounted to said subsidiary circuit board means forming said central interfacing means, said electrical connectors comprising at least first and second mounting means for connecting to corresponding respective mounting means on one and another of said modules to permit said another module to be mounted to said one module by connection to said central interfacing means,
    wherein said first and second mounting means provided on said subsidiary circuit board forming said central interfacing means include first and second electrical connectors,
    said first electrical connector comprising a plurality of first connecting pins extending from said circuit board in a substantially coplanar configuration therewith, and
    said second electrical connector comprising a plurality of second connecting pins extending from said circuit board substantially perpendicularly thereto.

2. An improved meter apparatus as recited in claim 1, wherein said electrical circuitry module includes function defining means for defining a function performed by said meter apparatus, thereby permitting a function performed by said meter apparatus to be interchanged by removal of said electrical circuitry module and by insertion of a different electrical circuitry module, defining a different function, into said meter apparatus.

3. An improved meter apparatus as recited in claim 2, further including register means and wherein said function defining means includes means for causing said measuring mechanism module to measure time of use of electrical power by a user, said means for causing being further operable for causing said register means to store a first value indicating an amount of power consumed by the user and a second value indicating a time during which said amount of power was consumed.

4. An improved meter apparatus as recited in claim 2, further including register means and wherein said function defining means includes means for causing said measuring mechanism module to measure a peak amount of power consumed by a user at a load throughout a billing cycle, said means for causing being further operable for causing said register means to store a value indicating said peak amount of power consumed by the user independently of a time during which said power was consumed.

5. An improved meter apparatus as recited in claim 1, wherein said central interfacing means comprises a printed circuit board, and said electrical interconnectors are comprised of conductive strips printed on said printed circuit board.

6. An improved meter apparatus as recited in claim 1, wherein said display register includes mechanical register means having plural mechanical displays and electrical register means having electronic display means, each housed in a separate module, thereby providing selection of either one, or both, of said mechanical or electrical register means to be included in said meter apparatus.

7. An improved meter apparatus as recited in claim 1 wherein said power supply module includes means for providing a predetermined output voltage for operating said measuring mechanism module, said electrical circuitry module and said display module from a predetermined input voltage service, thereby providing for said meter apparatus to be usable for a different input voltage service by removing said power supply module and inserting therefor a different power supply module having means for providing said predetermined output voltage from said different input voltage service.

8. An improved meter apparatus as recited in claim 7, wherein said electrical circuitry module includes function defining means for defining a function performed by said meter apparatus, thereby permitting a function performed by said meter apparatus to be interchanged by removal of said electrical circuitry module and by insertion of a different electrical circuitry module, defining a different function, into said meter apparatus.

9. An improved meter apparatus as recited in claim 8, further including register means and wherein said function defining means includes means for causing said measuring mechanism module to measure time of use of electrical power by a user, said means for causing being further operable for causing said register means to store a first value indicating an amount of power consumed by the user and a second value indicating a time during which said amount of power was consumed.

10. An improved meter apparatus as recited in claim 8, further including register means and wherein said function defining means includes means for causing said measuring mechanism module to measure a peak amount of power consumed by a user at a load throughout a billing cycle, said means for causing being further operable for causing said register means to store a value indicating said peak amount of power consumed by the user independently of a time during which said power was consumed.

11. An improved meter apparatus as recited in claim 1 wherein said separate subsidiary circuit board means is separate from said display register, said power supply, said measuring mechanism and said electrical circuitry modules.

12. An improved meter apparatus as recited in claim 11 wherein said first mounting means is operable for mounting onto corresponding mounting means on one of said modules and said second mounting means is operable for accepting corresponding mounting means on another of said modules.

13. An improved meter apparatus as recited in claim 1 wherein said first connecting pins extend from an edge of said subsidiary circuit board in said substantially coplanar configuration and
said second connecting pins extend from a location on said subsidiary circuit board in said substantially perpendicular configuration.

14. An improved meter apparatus as recited in claim 13 further comprising conductive strips arranged on said subsidiary printed circuit board for interconnecting predetermined ones of said first and second connecting pins of said first and second electrical connectors.

15. An improved meter apparatus as recited in claim 1 further comprising adapter means for mounting on said measuring mechanism, thereby to provide mechanical mounting for said mechanical interconnecting means of said modules and to provide retrofitting said modules onto preexisting measuring mechanisms.

16. An improved meter apparatus as recited in claim 15 wherein said adapter means comprises retaining means for manually mounting and removing said modules thereto independently of mechanical and electrical tools therefor.

17. An improved meter apparatus as recited in claim 16 wherein said adapter means includes a frame, said frame including a bracket having at least one opening for mounting on to at least one post projecting from said measuring mechanism;
said frame further including at least one post projecting therefrom for engaging at least one receptacle provided in one of said modules requiring connection to said measuring mechanism.

18. An improved meter apparatus as recited in claim 17 wherein said bracket is spaced from said frame towards said measuring mechanism, thereby permitting said at least one of said modules to be spaced apart from said measuring mechanism and permitting other modules to be engaged between said frame and said measuring mechanism.

19. An improved meter apparatus as recited in claim 15 wherein said frame adapter means further includes latch means connected thereto for engaging projections extending from a further module.

20. An improved meter apparatus as recited in claim 19 comprising a further bracket extending therefrom for engaging a portion of a sensor for a shutter disk component of said measuring mechanism.

21. An improved meter apparatus as recited in claim 19 comprising second latch means extending from said frame for engaging openings provided in spring arms connected to still a further module, said spring arms manually operable for disengaging said still further module from said second latch means.

22. An improved meter apparatus as recited in claim 18 wherein said frame further comprises spring means attached thereto for springing engagement of another of said modules thereto, said frame including a clearance therein for capturing projections from said another of said modules.

23. An improved meter apparatus as recited in claim 22 wherein said spring means includes manually operable tab means for manually releasing said another of said modules from engagement with said frame.

24. An improved meter apparatus as recited in claim 23 comprising latch means extending from said frame for engaging openings provided in spring arms connectd to still a further module, said spring arms manually operable for disengaging said still further module from said latch means.

25. An improved meter apparatus as recited in claim 22 comprising a latch means extending from said frame for engaging openings provided in spring arms connected to still a further module, said spring arms manually operable for disengaging said still further module from said latch means.

26. An improved meter apparatus as recited in claim 22 wherein said frame adapter means further includes latch means connected thereto for engaging projections extending from a further module.

* * * * *